(12) United States Patent
Derhacobian et al.

(10) Patent No.: US 6,369,433 B1
(45) Date of Patent: *Apr. 9, 2002

(54) HIGH VOLTAGE TRANSISTOR WITH LOW BODY EFFECT AND LOW LEAKAGE

(75) Inventors: Narbeh Derhacobian, Belmont; Pau-ling Chen, Saratoga; Hao Fang, Cupertino, all of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/182,525

(22) Filed: Oct. 30, 1998

(51) Int. Cl.⁷ .................. H01L 29/94; H01L 31/113; H01L 31/119
(52) U.S. Cl. .................. 257/399; 257/398; 257/519; 257/314
(58) Field of Search .................. 257/314, 315, 257/399, 398, 519

(56) References Cited

U.S. PATENT DOCUMENTS

| | | | | |
|---|---|---|---|---|
| 4,499,652 A | * | 2/1985 | Shrivastava | 29/571 |
| 4,725,872 A | * | 2/1988 | Blouke et al. | 357/24 |
| 4,956,691 A | * | 9/1990 | Culley et al. | 357/41 |
| 5,225,362 A | * | 7/1993 | Bergemont | 437/43 |
| 5,231,299 A | * | 7/1993 | Ning et al. | 257/316 |
| 5,444,279 A | * | 8/1995 | Lee | 257/316 |
| 5,455,790 A | * | 10/1995 | Hart et al. | 365/185.11 |
| 5,554,552 A | * | 9/1996 | Chi | 437/43 |
| 5,580,799 A | * | 12/1996 | Funaki | 437/35 |
| 5,585,656 A | * | 12/1996 | Hsue et al. | 257/321 |
| 5,679,599 A | * | 10/1997 | Mehta | 437/69 |
| 5,917,219 A | * | 6/1999 | Nandakumar | 257/348 |

* cited by examiner

Primary Examiner—Steven Loke
Assistant Examiner—Douglas W. Owens

(57) ABSTRACT

A high voltage transistor exhibiting low leakage and low body effect is formed while avoiding an excessive number of costly masking steps. Embodiments include providing a field implant blocking mask over the channel area, thereby producing a transistor with low body effect, the field implant blocking mask having appropriate openings so that the field implant occurs at the edges of the channel, thereby reducing leakage.

1 Claim, 4 Drawing Sheets

FIG. 1A
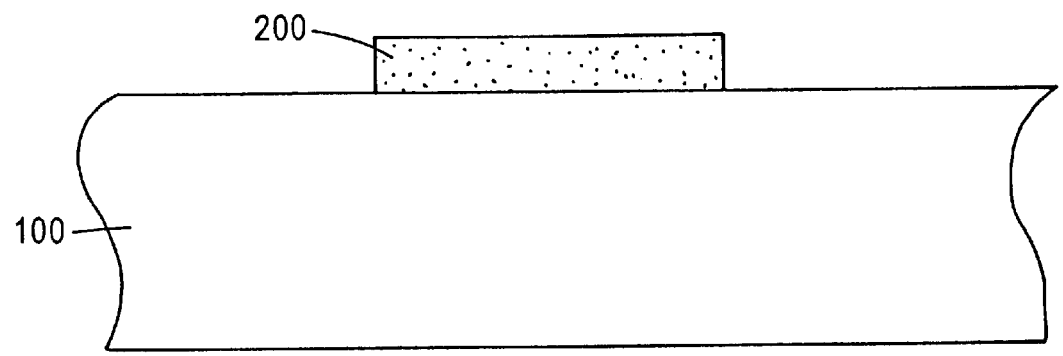
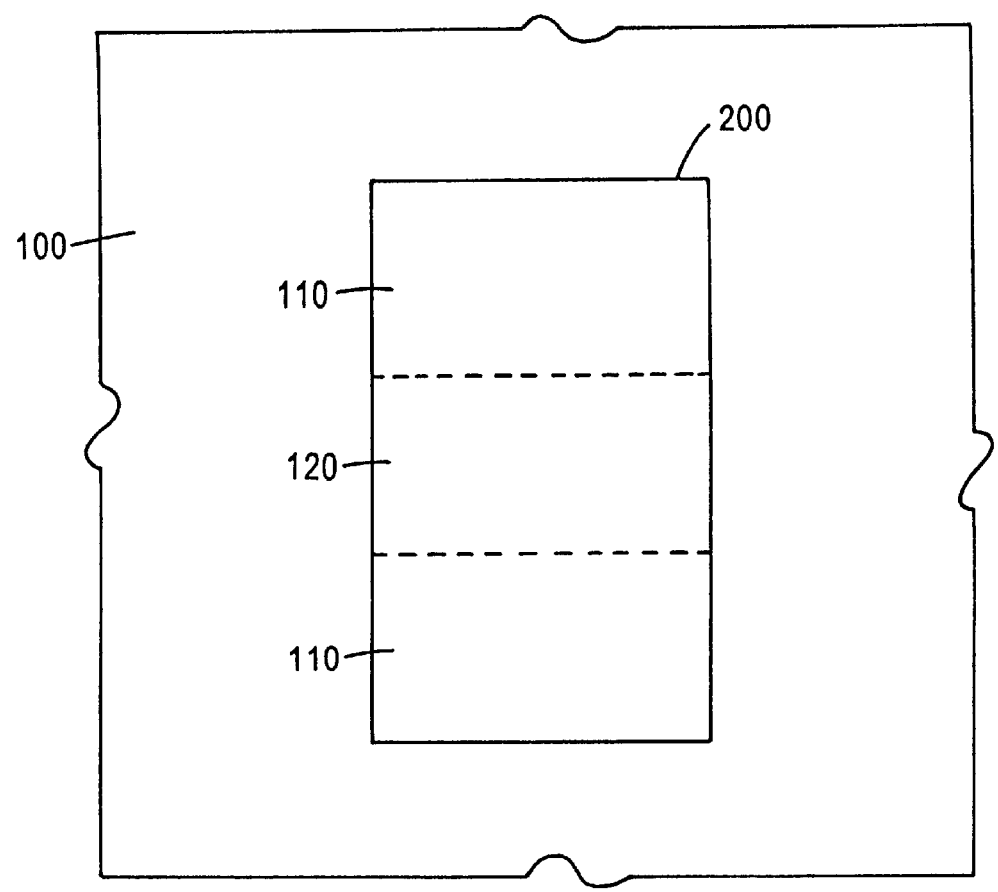
FIG. 1B

HIGH VOLTAGE TRANSISTOR WITH LOW BODY EFFECT AND LOW LEAKAGE

FIELD OF THE INVENTION

The present invention relates to a method of manufacturing a semiconductor device comprising a high-voltage transistor. The present invention has particular applicability in manufacturing nonvolatile semiconductor memory devices requiring a high programming voltage.

BACKGROUND ART

Conventional nonvolatile semiconductor memories such as flash electrically erasable programmable read only memories (Flash EEPROMs), typically comprise a floating gate memory cell, which includes a source region, a drain region and a channel region formed in a semiconductor substrate, and a floating gate formed above the substrate between the channel region and a control gate. One method of programming or erasing a floating gate memory cell, utilizing a phenomenon known as Fowler-Nordheim tunneling, comprises applying a voltage differential, such as about 16 volts to about 23 volts, to the control gate while the channel region is kept at a low voltage, such as about 0 volts to about 2 volts, to force electrons into the floating gate. This movement of electrons is referred to as programming, and the high voltage (i.e., about 16 to about 23 volts) applied to the control gate is known as program voltage. A similar method is employed to erase the memory cell by reversing the direction of bias to force the electrons out of the floating gate.

Flash memory systems conventionally comprise a two-dimensional array of floating gate memory cells. One such array architecture is called NAND architecture, which typically includes several strings, known as NAND strings, of floating gate memory transistors, each transistor coupled to the next transistor in the string by coupling the source of one device to the drain of the next device to form bit lines. A plurality of word lines, perpendicular to the NAND strings, each connect to the control gate of one memory cell of each NAND string.

To supply program voltage on demand to each of the word lines, a CMOS transistor referred to as a "row selector" is employed at one end of each word line. In order to attain an acceptable level of performance and reliability, this transistor must exhibit low leakage from drain to source and a low body effect so that its threshold voltage is not excessively high. Conventional processing techniques require many separate photolithographic masking steps to manufacture this transistor. The large number of masking steps raises the production cost of the flash memory device and increases the probability of defects in the finished device.

There exists a need for simplified methodology in manufacturing a high voltage, high performance transistor with fewer processing steps, thereby reducing manufacturing costs and increasing production throughput.

SUMMARY OF THE INVENTION

An advantage of the present invention is a simplified method of manufacturing a high voltage transistor which exhibits low leakage and low body effect.

Additional advantages and other features of the present invention will be set forth in part in the description which follows and in part will become apparent to those having ordinary skill in the art upon examination of the following or may be learned from the practice of the present invention.

The advantages of the present invention may be realized and obtained as particularly pointed out in the appended claims.

According to the present invention, the foregoing and other advantages are achieved in part by method of manufacturing a semiconductor device, which method comprises isolating a substantially rectilinear active area on a main surface of a semiconductor substrate, the active area comprising a first source/drain region and a second source/drain region, each having a source/drain width and a source/drain length, separated by a channel region having opposing ends not abutting either of the source/drain regions along the source/drain length; providing a field implant blocking mask over the channel region, the field implant blocking mask having a pair of substantially rectangular notches, each notch protruding over the channel region a predetermined distance along the source/drain width from one of the opposing ends of the channel region; and implanting impurities to form a field implant in the substrate.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein:

FIGS. 1A–1B are a cross-sectional view and a top view, respectively, of a phase of a method in accordance with an embodiment of the present invention.

DESCRIPTION OF THE INVENTION

Conventional methodologies for manufacturing high voltage transistors with low leakage and low body effect employ a large number of photoresist masking steps, which increases the cost of the finished device and reduces manufacturing yield. The present invention addresses and solves these problems stemming from conventional complex manufacturing processes.

In typical CMOS transistor manufacturing processes, active regions where source/drain and channel areas are to be formed are electrically isolated by the formation of a field oxide at the surface of a semiconductor substrate, and implantation of the substrate under the field oxide with impurities, such as boron. As used throughout the present disclosure and claims, the term "substrate" denotes a semiconductor substrate or an epitaxial layer formed on the semiconductor substrate. The isolated active regions are subdivided into source/drain and channel areas by further implantation of impurities. A gate oxide layer is then formed, followed by a threshold implant, such as p-type boron, through the gate oxide into the substrate to adjust the turn-on characteristics of the devices. After formation of gates above the channel regions, further implants are performed into the source/drain areas, such as a lightly-doped drain (LDD) implant followed by a relatively heavy n+ implant, such as arsenic at a dosage of $1\times10^{13}$ atoms cm$^{-2}$.

According to the methodology of the present invention, a high voltage CMOS transistor, such as an n-channel transistor, with low leakage and low body effect is formed by blocking the field implant from the channel region, but providing the field implant at the edges of the junctions.

Transistor body effect is a phenomenon whereby the threshold voltage (i.e., turn on voltage) of a transistor increases substantially in the presence of a slight bias on the substrate or source. Body effect is reduced significantly if there is no field implant in the channel area. Therefore, the present invention provides a field implant blocking mask over the channel area, thereby producing a transistor with low body effect.

The leakage characteristic of a transistor is an indication of its ability to shut off, measured by placing zero bias on the gate and a voltage lower than but close to the breakdown voltage (i.e., the voltage at which the drain junction breaks down and current begins to flow) on the junction, and noting the current flow from the drain to the source. Any leakage tends to occur at the edges of the transistor's source/drain regions where they border the channel region, and will increase if there is no field implant at these areas. Therefore, the inventive methodology provides for appropriate openings in the mask protecting the channel area from the field implant to implement a field implant at the edges of the channel. Thus, a transistor manufactured according to the present invention exhibits low leakage.

Figure 2:
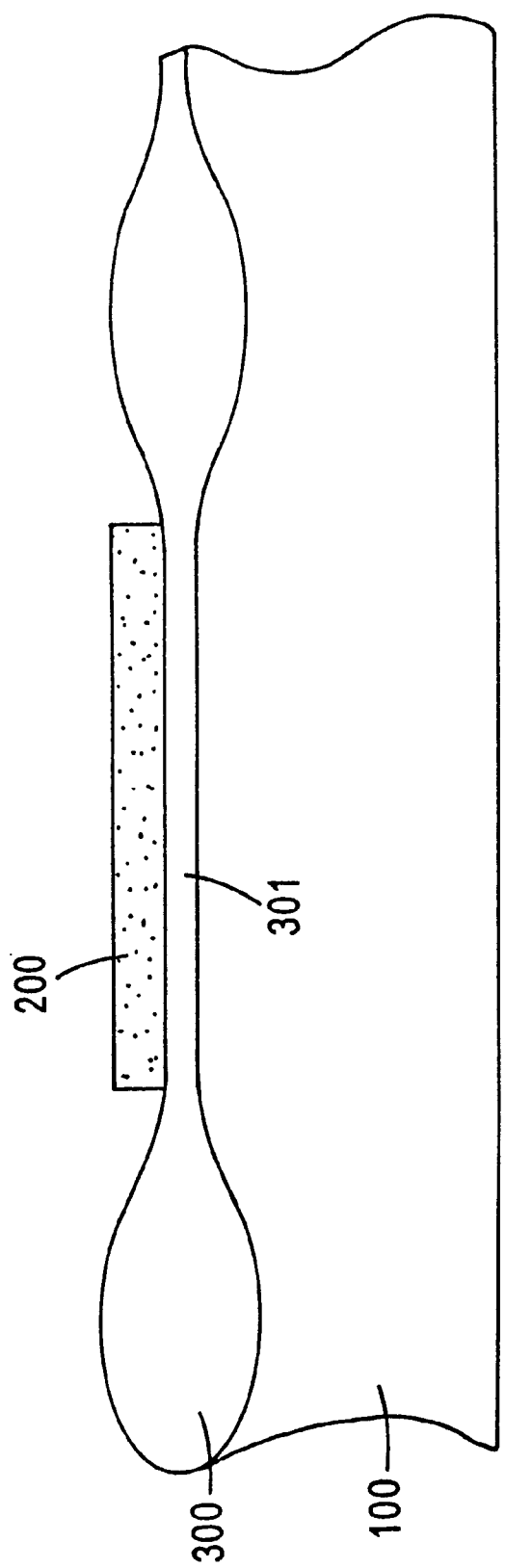
FIG. 2 is a cross-sectional view of a phase of a method in accordance with an embodiment of the present invention.

An embodiment of the present invention is illustrated in FIGS. 1A—4C, wherein sequential phases in forming a semiconductor device in accordance with the present invention are depicted. Referring to FIGS. 1A–1B, substrate 100 is prepared having a substantially planar surface, typically a semiconductor substrate comprising doped monocrystalline silicon or an epitaxial layer formed on a semiconductor substrate in accordance with conventional practices. A photoresist mask 200 is then formed on substrate 100 to protect the areas where device regions are to be formed, called the "active areas". The area shown in FIG. 1B which is protected by mask 200 is substantially rectilinear and comprises source/drain regions 110 separated by a channel region 120, where the source/drain regions and channel of a high voltage transistor are to be formed according to the present invention. A field oxide 300 is grown surrounding the active areas 110, 120, as depicted in FIG. 2, as by Local Oxidation of Silicon (LOCOS) by heating the substrate 100 while its unprotected regions are exposed to an oxidizing gas as, such as oxygen. Despite the provision of mask 200, a thin oxide layer 301 grows under mask 200 during the LOCOS process.

Figure 3A:
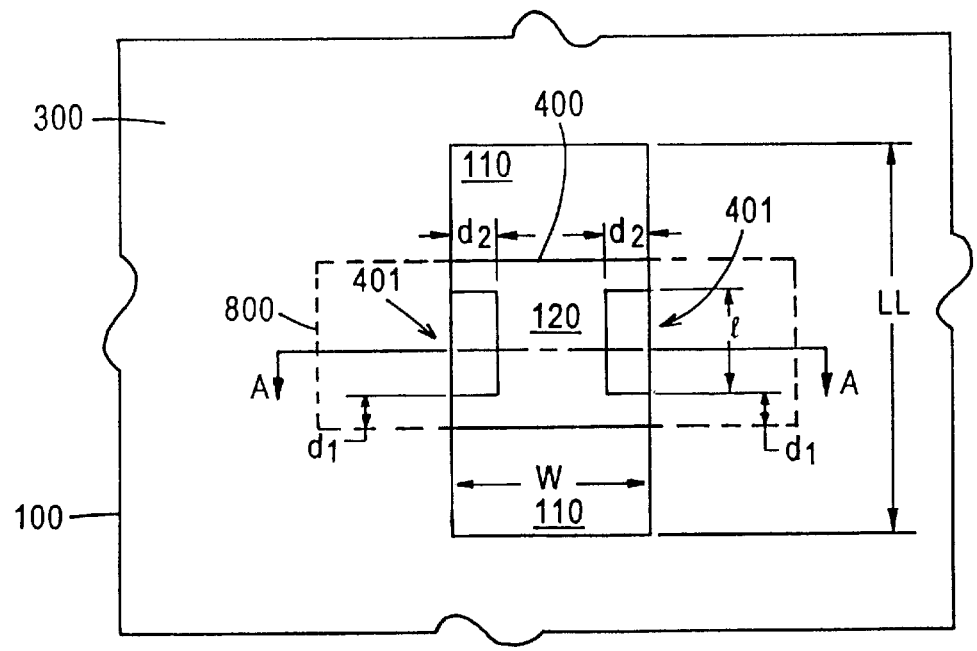
FIG. 3A is a top view of a phase of a method in accordance with an embodiment of the present invention.
Figure 3B:
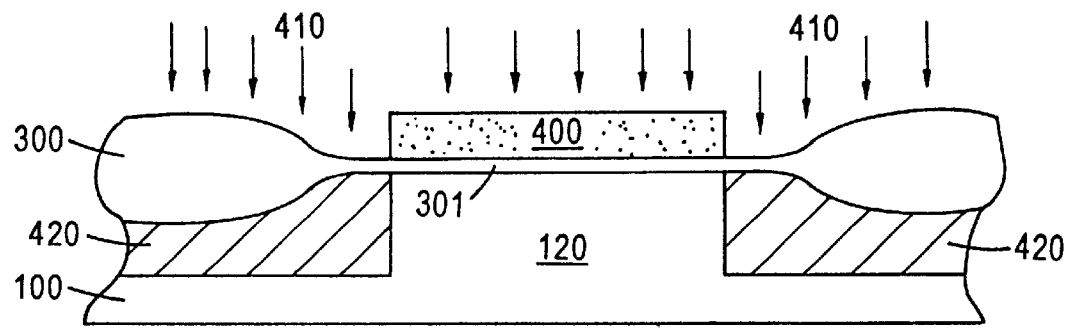
FIG. 3B is a cross-sectional view taken along the line A—A in FIG. 3A.

After removal of mask 200, a photoresist field implant blocking mask 400 is formed, as depicted in FIGS. 3A–3B, over channel region 120. Field implant blocking mask 400 has a pair of substantially rectangular notches 401, each of which has a notch length l such that mask 400 extends a distance $d_1$ onto channel region 120 corresponding to a region under opposing edges of subsequently formed gate 800 along the length LL of source/drain regions 110, and protrudes into channel region 120 a distance $d_2$ along a width W of source/drain regions 110. Distance $d_1$ is about 1.5 μm or less. Distance $d_2$, is about 1.0 μm or less, depending on the width of source/drain regions 110.

As shown in FIG. 3B, impurities 410 are implanted through field oxide 300 and channel region 120 to form the field implant 420, such as boron at a dosage of about $1\times10^{12}$ atoms cm$^{-2}$ to about $1\times10^{13}$ atoms cm$^{-2}$ and at an energy of about 80 keV to about 300 keV. This impurity implantation enhances the high-voltage transistor's field isolation and reduces leakage at the edges of source/drain regions 110 where they border channel region 120.

Figure 4A:
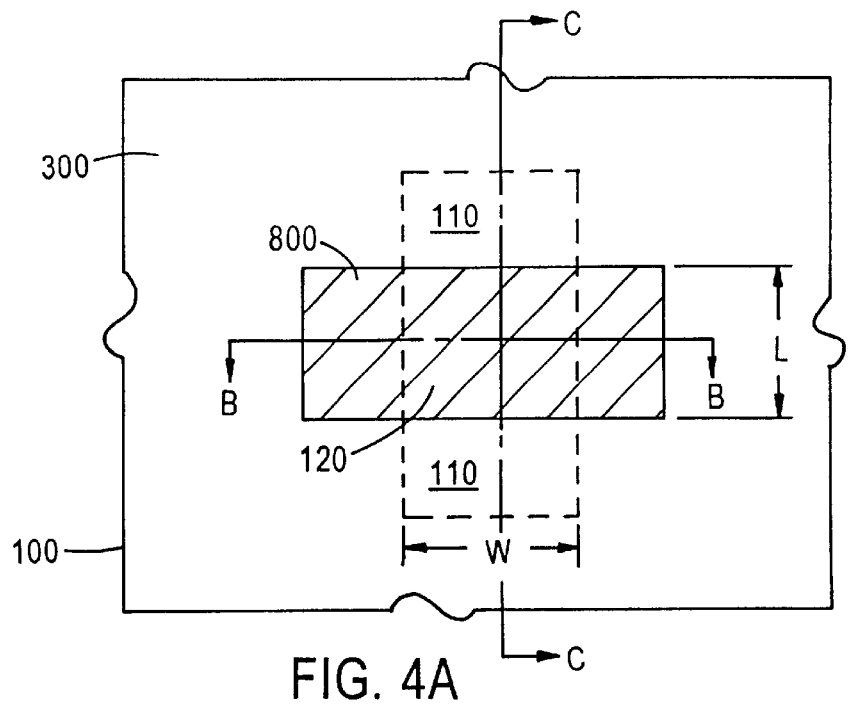
FIG. 4A is a top view of a phase of a method in accordance with an embodiment of the present invention.
Figure 4B:
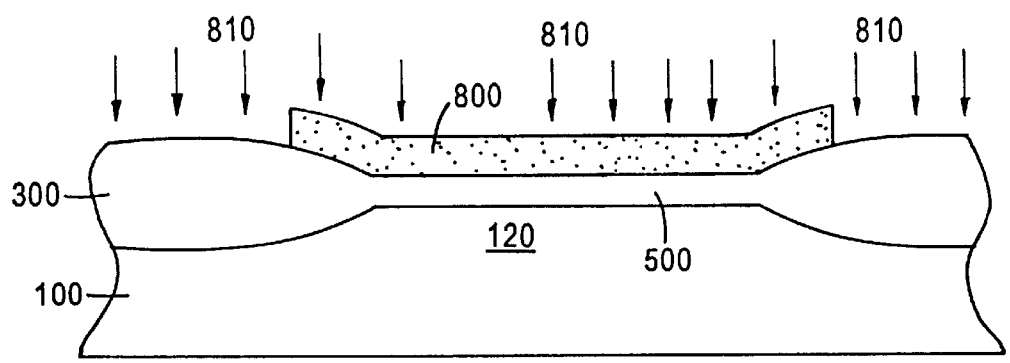
FIG. 4B is a cross-sectional view taken along the line B—B in FIG. 4A.
Figure 4C:
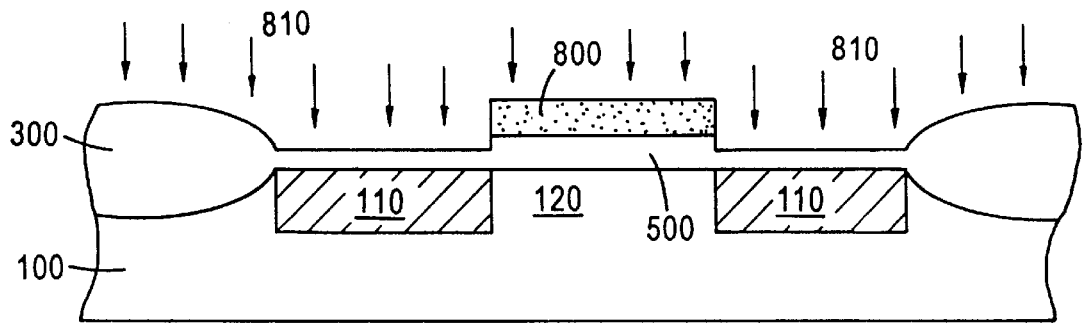
FIG. 4C is a cross-sectional view taken along the line C—C in FIG. 4A.

In subsequent processing steps, as depicted in FIGS. 4A–4C, a gate oxide layer 500 is formed over channel region 120, as by thermal oxidation, to a thickness of about 250 Å to about 450 Å. Then, impurities (not shown) are implanted through field oxide 300 and channel region 120 to form a threshold adjust implant, which controls the transistor's turn-on voltage. Gate 800 having a length L is formed over channel region 120, as by a polysilicon-based gate formation process, and implants 810 are then performed, conventionally an LDD implant and a heavy n+ implant, to form junctions between source/drain areas 110, channel region 120 and substrate 100.

A high-voltage transistor produced according to the inventive method, where the width W of source/drain regions 110 is about 20 μm and the length L of gate 800 is about 20 μm (see FIG. 4A), will typically exhibit a leakage current at room temperature at a drain voltage of about 20 volts less than or about equal to 10 pA. This transistor will also typically exhibit a low body effect; i.e., a linear threshold voltage of about 0.4 volts to about 0.7 volts at a drain voltage of about 0.1 volts, a source voltage of about 0 volts, and a substrate voltage of about 0 volts, and a linear threshold voltage of about 0.6 volts to about 1.0 volts at a drain voltage of about 0.1 volts, a source voltage of about 0 volts, and a substrate voltage of about −3.0 volts.

The inventive method provides appropriate openings in field implant blocking mask 400 to form a field implant 420 at the edges of the channel, thereby enabling the manufacture of a transistor exhibiting low leakage. Furthermore, field implant blocking mask 400 over channel area 120 produces a transistor with low body effect. The present invention is applicable to the manufacture of various types of high-voltage semiconductor devices, particularly high density semiconductor devices having a design rule of about 0.25 μm and under; e. g., about 0.18 μm and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A product produced by a method of manufacturing a semiconductor device, which method comprises:

isolating a substantially rectilinear active area on a main surface of a semiconductor substrate, the active area comprising a first source/drain region and a second source/drain region, each having a source/drain width and a source/drain length, separated by a channel region having opposing ends not abutting either of the source/drain regions along the source/drain length;

providing a field implant blocking mask over the channel region, the field implant blocking mask having a pair of substantially rectangular notches, each notch protruding over the channel region a predetermined distance along the source/drain width from one of the opposing ends of the channel region; and implanting impurities to form a field implant in the substrate and in portions of the channel region corresponding to the pair of notches.

* * * * *